United States Patent
Suchentrunk et al.

(10) Patent No.: US 9,960,051 B2
(45) Date of Patent: May 1, 2018

(54) ACTIVATION METHOD FOR SILICON SUBSTRATES COMPRISING AT LEAST TWO AROMATIC ACIDS

(71) Applicant: Atotech Deutschland GmbH, Berlin (DE)

(72) Inventors: Christof Suchentrunk, Berlin (DE); Christian Schwarz, Berlin (DE)

(73) Assignee: Atotech Deutschland GmbH, Berlin, DE (US)

( * ) Notice: Subject to any disclaimer, the term of this patent is extended or adjusted under 35 U.S.C. 154(b) by 0 days. days.

(21) Appl. No.: 15/545,758

(22) PCT Filed: Mar. 18, 2016

(86) PCT No.: PCT/EP2016/056047
§ 371 (c)(1),
(2) Date: Jul. 24, 2017

(87) PCT Pub. No.: WO2016/150879
PCT Pub. Date: Sep. 29, 2016

(65) Prior Publication Data
US 2018/0019137 A1    Jan. 18, 2018

(30) Foreign Application Priority Data
Mar. 20, 2015   (EP) .................................... 15160122

(51) Int. Cl.
| H01L 21/302 | (2006.01) |
| H01L 21/288 | (2006.01) |
| H01L 21/461 | (2006.01) |
| H01L 21/3205 | (2006.01) |
| C23C 18/16 | (2006.01) |
| H01L 21/768 | (2006.01) |
| C23C 18/38 | (2006.01) |
| C23C 18/36 | (2006.01) |

(52) U.S. Cl.
CPC .... H01L 21/32053 (2013.01); C23C 18/1642 (2013.01); C23C 18/1655 (2013.01); C23C 18/1678 (2013.01); C23C 18/36 (2013.01); C23C 18/38 (2013.01); H01L 21/288 (2013.01); H01L 21/76838 (2013.01)

(58) Field of Classification Search
CPC ... H01L 21/302; H01L 21/288; H01L 21/461; H01L 21/28518
See application file for complete search history.

(56) References Cited

U.S. PATENT DOCUMENTS

| 4,297,393 A | 10/1981 | Denning et al. |
| 4,617,205 A | 10/1986 | Darken |
| 5,405,656 A | 4/1995 | Ishikawa et al. |
| 5,753,304 A * | 5/1998 | Tung ...................... C23C 18/30 |
| | | 106/1.05 |
| 6,406,743 B1 | 6/2002 | Lee et al. |
| 7,220,296 B1 | 5/2007 | Chowdhury et al. |
| 9,175,399 B2 | 11/2015 | Brunner et al. |
| 2005/0101130 A1* | 5/2005 | Lopatin ............... C23C 18/1651 |
| | | 438/678 |
| 2005/0145133 A1 | 7/2005 | Shacham-Diamand et al. |
| 2005/0161338 A1 | 7/2005 | Fang et al. |
| 2005/0170650 A1* | 8/2005 | Fang ................... C23C 18/1893 |
| | | 438/689 |
| 2008/0223253 A1 | 9/2008 | Song et al. |
| 2012/0213914 A1 | 8/2012 | Ivanov et al. |
| 2013/0203252 A1* | 8/2013 | Wei ................... H01L 21/02697 |
| | | 438/682 |

FOREIGN PATENT DOCUMENTS

| EP | 3034650 | 12/2014 |
| GB | 976656 | 12/1964 |
| WO | 2013013941 | 1/2013 |
| WO | 2013113810 | 8/2013 |
| WO | 2013135396 | 9/2013 |
| WO | 2014128420 | 8/2014 |
| WO | 2014154702 | 10/2014 |

OTHER PUBLICATIONS

G. O. Mallory, J. B. Hajdu, Electroless Plating: Fundamentals and Applications, Reprint Edition, American Electroplaters and Surface Finishers Society, title and bibliographic pages and pp. 289-295 (1990).
PCT/EP2016/056047; PCT International Search Report and Written Opinion of the International Searching Authority dated Jun. 8, 2016.

* cited by examiner

*Primary Examiner* — Charles Boyer
(74) *Attorney, Agent, or Firm* — Renner, Otto, Boisselle & Sklar, LLP (57) ABSTRACT

The present invention relates to an activation composition for activation of silicon substrates, which is an aqueous solution comprising a source of palladium ions, a source of fluoride ions and at least two aromatic acids. The present invention further relates to a method for its use and optionally for subsequent metallization of such treated substrates. The method can be employed in semiconductor and solar cell manufacturing.

21 Claims, 8 Drawing Sheets

ACTIVATION METHOD FOR SILICON SUBSTRATES COMPRISING AT LEAST TWO AROMATIC ACIDS

The present application is a U.S. National Stage Application based on and claiming benefit and priority under 35 U.S.C. § 371 of International Application No. PCT/EP2016/056047, filed 18 Mar. 2016, which in turn claims benefit of and priority to European Application No. 15160122.6 filed 20 Mar. 2015, the entirety of both of which is hereby incorporated herein by reference.

FIELD OF THE INVENTION

The invention relates to the manufacturing of solar cells and electronic devices, in particular to an activation method of silicon substrates prior to electroless metallization and the formation of silicide interconnects which can be used in transistors (MOS, CMOS), memory sticks, MS and SD cards.

BACKGROUND OF THE INVENTION

Generally, silicide interconnects are formed by electroless deposition of metals such as nickel on suitable silicon substrates followed by subsequent heat treatment to form the metal silicide. This heat treatment is conventionally referred to as rapid thermal annealing (RTA). Typically, this heat treatment requires a substrate to be submitted to elevated temperatures ranging from 300 to 750° C. whereby the metal diffuses into the silicon substrate upon formation of the metal silicide. For a metal to be deposited on silicon substrates the latter need to be activated. This is especially the case for p-doped polysilicon. n-doped substrates can be directly plated with strongly alkaline electroless nickel plating baths. However, strongly alkaline media may damage substrates used in the manufacturing of semiconductors such as solder masks. Hence, the use of strongly alkaline plating baths is not desired in the art. Therefore, it is a common technique to activate silicon substrates with compositions comprising palladium ions and hydrofluoric acid or other sources of fluoride ions as disclosed in GB 976,656. A possible mechanism for this kind of activation is disclosed in U.S. Pat. No. 4,297,393.

U.S. Pat. No. 6,406,743 B1 relates to nickel-silicide formation on polysilicon interconnects. The method disclosed therein teaches the use of a solution containing palladium salts and high concentrations of hydrofluoric acid and acetic acid as activation composition for polysilicon prior to nickel or nickel alloy deposition. Regardless of the high toxicity associated with the use of such concentrated hydrofluoric acid solution, the use of such composition results in very coarse palladium seeds to be obtained. In order to provide uniform nickel silicide coverages on such coarse palladium seeds, it is required to provide a thick nickel deposit thereon which in turn leads to too big structures to be used in modern semiconductor technology (see examples 1 and 2).

U.S. Pat. No. 5,753,304 reports an activation solution which is particularly useful for aluminium surfaces. Said activation solution comprises inter alia palladium salts, alkali metal fluoride or hydrogen fluoride, and carboxylic acids as complexing agents. Said carboxylic acids are employed in quantities of approximately 10 to 100 ml/l of activation solution.

US 2005/0161338 A1 discloses a method of activating silicon surfaces with aqueous solutions comprising a source of palladium and at least one acid. Useful acids in the disclosure are manifold such as mineral acids like sulphuric acid, nitric acid and hydrochloric acid, or organosulphuric acids such as methanesulphuric acid or aromatic sulphonic acids such as para-toluenesulphonic acid. The use of one aliphatic or aromatic acid, however, results in too inhomogeneous coverages of treated surfaces (see examples 2 to 4).

WO 2014/128420 discloses the use of a composition comprising an anionic or non-ionic surfactant, gold ions and fluoride ions for the activation of semiconductor substrates. The employment of a surfactant improves the results and allows for thinner nickel layers to be formed. According to this disclosure a composition containing palladium and fluoride ions results in a non-uniform deposition and diffusion of the subsequent nickel layer on and into the substrate (pages 2, 14 and 15 and table 1, entry 1). The use of gold ions is undesired in the manufacture of electronic devices for several reasons such as costs.

Although these methods are capable of providing a method for the activation of silicon substrates and a subsequent nickel silicide formation, they do not fulfil the requirements of modern semiconductor manufacturing. The seed layers of the noble metals employed are too coarse and the distribution of the individual seeds on the surface of the silicon substrate is not homogeneous enough with the result that too thick nickel layers have to be deposited on the substrate. Furthermore, if the noble metal distribution is too coarse, the individual noble metal particles are also bigger leading to increased cost due to the high price of noble metals in general. Even more importantly, the metal or metal layers on silicon substrates are required to be very thin and homogeneous in height. Thus, they need to be levelled and smooth. A prerequisite therefor is that the underlying palladium seed layers are very homogeneous and the substantially free of big aggregated particles. It is particularly disadvantageous if palladium seeds are as big as the desired metal or metal alloy layer to be formed thereon (or even bigger). The metal or metal alloy layer formed thereupon will otherwise form on those big particles and a very rough (giving structures like valleys and hills) surface will be formed requiring a polishing step, especially if metal or metal alloy layers in the range of 5, 10, 20 or 50 nm are to be formed. This is incompatible with the ongoing miniaturization and cost and environmental awareness in the semiconductor manufacturing industry.

OBJECTIVE OF THE INVENTION

It is therefore the objective of the present invention to overcome the drawbacks as mentioned above and to provide an activation composition and a method for its use which especially allows for the formation of very thin palladium seed layers on silicon substrates with an excellent surface coverage thereof.

It is therefore a further objective of the present invention to provide silicon substrates with homogenously covered palladium seed layers thereon which can be used for electroless metallization.

It is another objective of the present invention to provide a method of metal silicide interconnect formation, in particular nickel silicide interconnect formation, which complies with today's demands of miniaturization in the semiconductor industry.

SUMMARY OF THE INVENTION

These objectives are solved by using an activation composition according to the invention. The activation composition according to the invention for activation of silicon substrates is an aqueous solution comprising a source of palladium ions and a source of fluoride ions which is characterized in that it comprises at least two aromatic acids (independently from each other) selected from the group consisting of aromatic carboxylic acids, aromatic sulphonic acids, aromatic sulphinic acid, aromatic phosphonic acids and aromatic phosphinic acids.

These objectives are further solved by the inventive method for activating at least one silicon substrate which comprises the following steps in the given order
(i) providing the at least one silicon substrate;
(ii) activating at least a part of the surface of said at least one silicon substrate with an aqueous solution as activation composition which comprises a source of palladium ions, a source of fluoride ions and at least two aromatic acids (independently from each other) selected from the group consisting of aromatic carboxylic acids, aromatic sulphonic acids, aromatic sulphinic acid, aromatic phosphonic acids and aromatic phosphinic acids.

BRIEF DESCRIPTION OF THE FIGURES

FIGS. 3 to 7 relate to examples 4a to 4e.

DETAILED DESCRIPTION OF THE INVENTION

The inventive activation composition for activation of silicon substrates is an aqueous solution comprising a source of palladium ions, a source of fluoride ions and at least two aromatic acids selected from the group consisting of aromatic carboxylic acids, aromatic sulphonic acids, aromatic sulphinic acids, aromatic phosphonic acids and aromatic phosphinic acids. In a preferred embodiment of the present invention, the at least two aromatic acids are selected from the group consisting of aromatic carboxylic acids, aromatic sulphonic acids and aromatic phosphonic acids.

An aromatic carboxylic acid is to be understood in the context of the present invention to be an aromatic compound comprising at least one carboxylic acid moiety (—$CO_2H$). Similarly, an aromatic sulphonic acid is an aromatic compound comprising at least one sulphonic acid moiety (—$SO_3H$). An aromatic sulphinic acid is an aromatic compound comprising at least one sulphinic acid moiety (—$SO_2H$), an aromatic phosphonic acid is an aromatic compound comprising at least one phosphonic acid moiety (—$PO_3H_2$) and an aromatic phosphinic acid is an aromatic compound comprising at least one phosphinic acid moiety (—$PO_2H_2$).

The aromatic compound further comprises at least one ring-shaped hydrocarbon group, for example phenyl or naphthyl, wherein individual ring carbon atoms may be replaced by N, O and/or S, for example benzothiazolyl or pyridinyl (e.g. in 3-pyridine carboxylic acid which is often referred to as nicotinic acid). Furthermore, individual hydrogen atoms bound to the aromatic compound may in each case be substituted by a functional group, for example amino, hydroxyl, nitro, alkyl, aryl, halides such as fluoride, chloride, bromide, iodide, carbonyl, esters derived from any of the aforementioned acid moieties and so forth. The aromatic compound may also comprise at least one hydrocarbon group consisting of two or more condensed rings like phenanthrene or anthracene as long as enough functional groups are attached thereto to guarantee water solubility in high enough a concentration. The terms "hydroxy" and "hydroxyl" as organic moieties are used interchangeably herein. Moiety is sometimes referred to as residue or radical in the art.

In so far as the term "alkyl" is used in this description and in the claims, it refers to a hydrocarbon group with the general chemical formula $C_mH_{2m+1}$, m being an integer from 1 to about 50. Alkyl moieties according to the present invention can be linear and/or branched and they can be saturated and/or unsaturated. If the alkyl moieties are unsaturated the corresponding general chemical formula has to be adjusted accordingly. Preferably, m ranges from 1 to 12, more preferably from 1 to 8, even more preferably from 1 to 4. $C_1$-$C_8$-alkyl for example includes, among others, methyl, ethyl, n-propyl, iso-propyl, n-butyl, iso-butyl, tert-butyl, n-pentyl, iso-pentyl, sec-pentyl, tert-pentyl, neo-pentyl, hexyl, heptyl and octyl. One or more hydrogen atoms of such an alkyl group may also be substituted by functional groups, for example amino, hydroxy, thiol, halides such as fluoride, chloride, bromide, iodide, carbonyl, carboxyl, carboxylic acid esters, phosphonates and so forth.

At least one of the acid moieties is preferably bound directly to the aryl group(s) of the aromatic compounds via a carbon-carbon, carbon-sulphur or carbon-phosphorous single bond. More preferably, all of the acid moieties are bound directly to the aryl group(s).

In a preferred embodiment of the present invention the at least two aromatic acids are (independently from each other) selected from aromatic acids according to formulae (I) and (II)

wherein $R^1$ to $R^{14}$ are independently from each other selected from the group consisting of hydrogen (—H), alkyl, aryl, halides such as chloride (—Cl), amino (—NH$_2$), carboxylic acid moiety (—CO$_2$H), sulphonic acid moiety (—SO$_3$H), sulphinic acid moiety (—SO$_2$H), phosphonic acid moiety (—PO$_3$H$_2$), phosphinic acid moiety (—PO$_2$H$_2$), nitro (—NO$_2$) and hydroxyl (—OH), with the proviso that at least one of R$^1$ to R$^{14}$ is a carboxylic acid moiety (—CO$_2$H), a sulphonic acid moiety (—SO$_3$H), a sulphinic acid moiety (—SO$_2$H), a phosphonic acid moiety (—PO$_3$H$_2$) or a phosphinic acid moiety (—PO$_2$H$_2$), preferably a sulphonic acid moiety, a carboxylic acid moiety or a phosphonic acid moiety. Independently from each other therein means that the at least two aromatic acids according to formulae (I) or (II) can be selected as both from formulae (I), both from formulae (II) or from one formulae (I) and one from formulae (II).

Carboxylic acid moiety (—CO$_2$H), sulphonic acid moiety (—SO$_3$H), sulphinic acid moiety (—SO$_2$H), phosphonic acid moiety (—PO$_3$H$_2$) and phosphinic acid moiety (—PO$_2$H$_2$) are summarized herein as "acid moieties".

Preferably, only one type of acid moiety is comprised in a single aromatic acid. That means that e.g. if an aromatic acid comprises one or more carboxylic acid moieties, it is preferably free of other acid moieties like sulphonic, sulphinic, phosphonic and phosphinic acid moieties.

Aromatic acids according to formulae (I) to (II) are generally soluble enough in water to be used in the activation composition according to the invention. If the aromatic acid is not soluble enough co-solvents and surfactants known to the skilled person may be employed to increase the solubility of aromatic acids in the activation composition.

In an even more preferred embodiment of the present invention, at least one aromatic acid of the at least two aromatic acids in the activation composition comprises a sulphonic acid moiety. In a second even more preferred embodiment of the present invention, the activation composition comprises at least one aromatic acid of the at least two aromatic acid which comprises a carboxylic acid moiety. In a third even more preferred embodiment of the present invention, the activation composition contains at least one aromatic acid which comprises a sulphonic acid moiety and at least one aromatic acid which comprises a carboxylic acid moiety.

In an aromatic sulphonic acid according to formulae (I) or (II) which consequently comprises at least one sulphonic acid moiety, it is preferred that at least one of the remaining R$^1$ to R$^{14}$ is hydroxyl and/or amino. More preferably is that all of the remaining R$^1$ to R$^{14}$ are selected independently from each other from hydrogen, amino and hydroxyl. Such acids in an activation composition seem to improve the surface coverage of such treated silicon substrate.

In another even more preferred embodiment, the at least two aromatic acid to be employed in the activation composition according to the invention are selected from the group consisting of benzoic acid, 1,2-benzene dicarboxylic acid (phthalic acid), 1,3-benzenedicarboxylic acid (isophthalic acid), 1,4-benzene dicarboxylic acid (terephthalic acid), 1,2,3-benzene tricarboxylic acid (hemimellitic acid), 1,2,4-benzene tricarboxylic acid (trimellitic acid), 1,3,5-benzene tricarboxylic acid (trimesic acid), 1,2,4,5-benzene tetracarboxylic acid (pyromellitic acid), 1,2,3,4,5-benzene pent carboxylic acid, 1,2,3,4,5,6-benzene hexacarboxylic acid (mellitic acid), 2-nitrobenzoic acid, 3-nitrobenzoic acid, 4-nitrobenzoic acid, 2,5-dinitrobenzoic acid, 2,6-dinitrobenzoic acid, 3,5-dinitrobenzoic acid, 2,4-dinitrobenzoic acid, 3,4-dinitrobenzoic acid, 2-aminobenzoic acid, 3-aminobenzoic acid, 4-aminobenzoic acid, 3,4-diaminobenzoic acid, 3,5-diaminobenzoic acid, 2,3-aminobenzoic acid, 2,4-diaminobenzoic acid, salicylic acid, p-toluenesulphonic acid, 1-naphthoic acid, 2-naphthoic acid, 2,6-naphthalenedicarboxylic acid, 2-naphthalenesulphonic acid, 5-amino-1-naphtalenesulphonic acid, 5-amino-2-naphtalenesulphonic acid, 7-amino-4-hydroxy-2-naphthalenesulphonic acid and phenyl phosphonic acid.

The aromatic acids may be added to the activation composition as free acids, as respective salts such as alkali salts or ammonium salts, as hydrates thereof or as any suitable combination of the aforementioned. They also may be added as anhydrides if applicable (e.g. phthalic acid anhydride is capable of forming phthalic acid in aqueous media).

The use of two or more aromatic acids in the activation composition according to the invention advantageously allows for finer palladium particles (also called seeds) to be formed on the surface of a thus treated silicon substrate. The addition of two or more aromatic acids also results in an improved homogeneity of the thus deposited palladium particles on the surface of the silicon substrate. With only one aromatic acid or without any aromatic acid, the palladium particles are much coarser and less homogeneously distributed on the surface of the silicon substrate (see comparative examples).

The inventors have found that the surface coverage of the silicon substrates is more homogeneous and the individual particles are smaller when using two or more aromatic acids in the activation composition.

The concentration of aromatic acids (which means in this context the total concentration of all used aromatic acids) in the activation composition ranges preferably from 0.1 to 1000 mg/L, more preferably from 1 to 750 mg/L, even more preferably from 10 or 40 to 500 mg/L. Concentrations outside said ranges in some cases allow for less beneficial effects of the present invention to be obtained such as homogeneous coverage of the treated surface with palladium seeds. Also, solubility issues with some aromatic acids may arise.

The activation composition according to the invention is an aqueous solution. The term "aqueous solution" means that the prevailing liquid medium, which is the solvent in the solution, is water. Further liquids, that are miscible with water, as for example alcohols and other polar organic liquids, that are miscible with water, may be added. Preferably, the activation composition comprises only water as solvent.

The inventive activation composition comprises a source of palladium ions. The source of palladium ions can be any water-soluble palladium salt or palladium complex. Preferably, the source of palladium ions is selected from the group consisting of palladium chloride, palladium sulphate, palladium sulphate as sulphuric acid complex, palladium nitrate and palladium acetate, more preferably selected from the group consisting of palladium chloride, palladium sulphate, palladium nitrate and palladium acetate.

The concentration of palladium ions in the inventive activation composition preferably ranges from what 0.001 to 1 g/L, more preferably from 0.005 to 0.5 g/L, even more preferably from 0.05 to 0.25 g/L.

The inventive activation composition further comprises a source of fluoride ions. This source of fluoride ions can be any water-soluble fluoride salt or any water-soluble fluoride complex. Preferably, the source of fluoride ions is selected from hydrofluoric acid, ammonium fluoride and alkali fluoride such as potassium fluoride, sodium fluoride and lithium fluoride.

The concentration of fluoride ions present in the activation composition preferably ranges from 0.075 to 4 wt.-%, more preferably from 0.1 to 2 wt.-%, even more preferably from 0.15 to 1 wt.-%. It is known in the art that higher concentration of fluoride ions will result in increased solubilisation of silicon atoms from the substrate to be treated with the inventive activation composition. In order to treat very thin and fragile silicon substrates it is therefore advantageous to use lower concentrations of fluoride ions in the inventive activation composition.

The inventive activation composition preferably has a pH of 7 or below, more preferably below 3, even more preferably from 0 to 2.5.

The inventive activation composition optionally comprises methane sulphonic acid and/or a mineral acid selected from the group consisting of sulphuric acid, hydrochloric acid, nitric acid, phosphoric acid, methane sulphonic acid, hydrobromic acid, hydrogen iodide, perchloric acid, aqua regia, hydrochlorous acid, iodic acid and nitrous acid. Preferably, the optional mineral acid is selected from sulphuric acid, hydrochloric acid and nitric acid. The concentration of the optional mineral acid (or methane sulphonic acid) ranges from 0.01 to 20 wt.-% or preferably from 0.1 to 10 wt.-%.

The inventive activation composition optionally comprises an oxidising agent selected from the group consisting of molecular oxygen, a source of nitrate such as potassium nitrate and hydrogen peroxide. Molecular oxygen may be added as gas feed to the activation composition. It is known in the art that the optional addition of oxidising agent, methane sulphonic acid and/or mineral acid may result in an accelerated activation process. However, this is not always desired.

The inventive activation composition optionally comprises a surfactant (also referred to as wetting agent in the art) selected from the group consisting of cationic, non-ionic and anionic surfactants.

The activation composition according to the invention may be prepared by dissolving all components in aqueous liquid medium, preferably in water.

The inventive method for activating at least one silicon substrate which comprises the following steps in the given order
(i) providing the at least one silicon substrate;
(ii) activating at least a part of the surface of said at least one silicon substrate with an activation composition according to the invention.

The at least one silicon substrate to be used in the inventive method comprises (one or more) surfaces made of silicon such as polysilicon (including doped polysilicon such as p-doped polysilicon and n-doped polysilicon) and monocrystalline silicon, silicon oxide, silicon nitride and silicon oxynitride. The silicon substrates may be made in their entirety of any of the aforementioned materials or combinations thereof or they may only comprise surfaces made of one or more of the aforementioned materials.

Doping of polysilicon is conventionally done with donors such as arsenic or phosphorous resulting in n-doped polysilicon, and acceptors such boron or aluminium giving p-doped polysilicon. Generally, these donors/acceptors are used in a content of between $10^{-4}$-$10^{-9}$ wt.-%. If very high amounts of dopants (usually between than $10^{-3}$ and $10^{-4}$ wt.-%) are used, n- and p-doped polysilicon are obtained. n- and p-doped polysilicon are also understood in the context of the present invention as n- and p-doped polysilicon. In a similar fashion as described above, silicon oxide, silicon nitride and silicon oxynitride may be doped.

Preferably, polysilicon, p-doped polysilicon and n-doped polysilicon are used; more preferably p-doped polysilicon is used in the inventive method.

In view of activation at least a part of the surface of said at least one silicon substrate the substrate or the surface of said substrate is contacted with the activation composition according to the invention (in step (ii)) by means known in the art and whereby the surface of said at least one silicon substrate is activated. Contact between the surface of the silicon substrate and the activation composition include inter alia immersion of the silicon substrate into the composition or wiping, spraying or otherwise bringing the activation composition onto said surface.

Upon contacting the silicon substrate with the activation composition according to the invention a thin and homogeneously dispersed palladium seed layer will be formed on the silicon substrate's surface. This step is referred to as activation in the art. Such treated substrate is hence called "activated".

The substrate is activated with the activation composition for 1 second to 30 minutes, preferably for 30 seconds to 10 minutes, more preferably for 40 seconds to 5 minutes, most preferred for 45 seconds to 2 minutes. Depending on the desired properties of the activated substrate contact durations outside of above-captioned ranges may be applied.

The activation solution preferably has a temperature ranging from 10 to 90° C., more preferred from 15 to 50° C., when contacted with the silicon substrate.

It is understood in the context of the present invention that semiconductor substrates comprising many doped regions (such as sources and drains, S/D), insulating (e.g. doped and undoped silicon oxides) and conducting layers (e.g. doped and undoped polysilicon, metal) over a silicon base can be used. The method also can be applied to monocrystalline or polycrystalline silicon used in the manufacture of solar cells.

The inventive method for activating a silicon substrate may comprise a further step after step (ii)
(iii) electroless plating of a metal or a metal alloy on the activated silicon substrate.

Electroless plating is the controlled autocatalytic deposition of a continuous film of metal without the assistance of an external supply of electrons. The main components of electroless metal plating baths are the source of metal ions, a complexing agent, a reducing agent, and, as optional ingredients stabilising agents, grain refiners and pH adjustors (acids, bases, buffers). Complexing agents (also called chelating agents in the art) are used to chelate the metal to be deposited and prevent the metal from being precipitated from solution (i.e. as the hydroxide and the like). Chelating metal renders the metal available to the reducing agent which converts the metal ions to their metallic form. A further form of metal deposition is immersion plating. Immersion plating is another deposition of metal without the assistance of an external supply of electrons and without chemical reducing agent. The mechanism relies on the substitution of metals from an underlying substrate for metal ions present in the immersion plating solution. In the context of the present invention electroless plating is to be understood predominately as autocatalytic deposition with the aid of a chemical reducing agent (referred to a "reducing agent" herein).

In order to adjust the properties of the electroless metal plating bath and the metal or metal alloy deposit to be formed when using such an electroless plating bath, additives are added to the electroless plating bath in order to improve the properties both the electroless plating bath and the formed metal or metal alloy deposit. Generally, electroless metal plating baths are known in the art for many metals and metal alloys.

A metal or metal alloy is deposited on the activated silicon substrate in step (iii). The metal or metal alloy preferably to be deposited in step (iii) is selected from copper, cobalt, nickel, copper alloy, cobalt alloy and nickel alloy. It is a more preferred embodiment of the present invention that the metal to be deposited is nickel or an alloy thereof as nickel silicides are a suitable replacement for tantalum or titanium silicides in chip making. An electroless metal plating bath capable of depositing nickel or nickel alloys is herein referred to as electroless nickel plating bath.

The electroless nickel plating bath contains at least one source of nickel ions which may be any water soluble nickel salts or other water soluble nickel compound. Preferred sources of nickel ions are selected from the group comprising nickel chloride, nickel sulphate, nickel acetate, nickel methanesulphonate and nickel carbonate. The concentration of nickel ions in the electroless nickel plating bath preferably ranges from 0.1 to 60 g/l (0.0017 to 1.022 mol/l), more preferably from 2 to 50 g/l (0.034 to 0.852 mol/l), even more preferably from 4 to 10 g/l (0.068 to 0.170 mol/l).

The electroless nickel plating bath further contains a reducing agent which is selected from hypophosphite compounds such as sodium hypophosphite, potassium hypophosphite and ammonium hypophosphite, boron based reducing agents such as aminoboranes like dimethylaminoborane (DMAB), alkali borohydrides like $NaBH_4$, $KBH_4$, formaldehyde, hydrazine and mixtures thereof. The concentration of reducing agent (which means in this connection the total amount of reducing agents) in the electroless nickel plating bath typically ranges from 0.01 to 1.5 mol/l.

The pH value of the electroless nickel plating bath preferably ranges from 3.5 to 8.5, more preferably from 4 to 6. Since the plating solution has a tendency to become more acidic during its operation due to the formation of $H_3O^+$ ions, the pH may be periodically or continuously adjusted by adding bath-soluble and bath-compatible alkaline substances such as sodium, potassium or ammonium hydroxides, carbonates and bicarbonates. The stability of the operating pH of the plating solutions can be improved by the addition of various buffer compounds such as acetic acid, propionic acid, boric acid, or the like, in amounts of up to 30 g/l, more preferably from 2 to 10 g/l.

In one embodiment of the present invention, carboxylic acids, polyamines and sulphonic acids or mixtures thereof are selected as complexing agents. Useful carboxylic acids include mono-, di-, tri- and tetra-carboxylic acids. The carboxylic acids may be substituted with various substituent moieties such as hydroxy or amino groups and the acids may be introduced into the electroless nickel plating baths as their sodium, potassium or ammonium salts. Some complexing agents such as acetic acid, for example, may also act as a buffering agent, and the appropriate concentration of such additive components can be optimised for any plating solution in consideration of their dual functionality.

Examples of such carboxylic acids which are useful as the complexing agents include: iminosuccinic acid, iminodisuccinic acid, derivatives thereof and salts thereof as disclosed in WO 2013/113810, monocarboxylic acids such as acetic acid, hydroxyacetic acid, aminoacetic acid, 2-amino propanoic acid, 2-hydroxy propanoic acid (lactic acid); dicarboxylic acids such as succinic acid, amino succinic acid, hydroxy succinic acid, propanedioic acid, hydroxybutanedioic acid, tartaric acid, malic acid; tricarboxylic acids such as 2-hydroxy-1,2,3-propane tricarboxylic acid; and tetracarboxylic acids such as ethylene-diamine-tetra-acetic acid (EDTA). The most preferred complexing agents are selected from the group consisting of monocarboxylic acids and dicarboxylic acids. In one embodiment, mixtures of two or more of the above complexing agents are utilized. The concentration of the complexing agent present in the electroless nickel plating bath or, in case more than one complexing agent is used, the concentration of all complexing agents together preferably ranges from 0.01 to 2.5 mol/l, more preferably from 0.05 to 1.0 mol/l.

The electroless nickel plating bath optionally contains at least one stabilising agent. Such stabilising agent is required in order to provide a sufficient bath lifetime, a reasonable plating rate and to control the phosphorous or boron content in the as deposited nickel alloy. Suitable optional stabilising agents are, without limitation, heavy metal ions such as cadmium, thallium, bismuth, lead and antimony ions, iodine containing compounds such as iodide and iodate, sulphur containing compounds such as thiocyanate, thiourea and mercaptoalkanesulphonic acids like 3-mercaptopropanesulphonic acid or the respective disulphides derived therefrom as disclosed in WO 2013/013941 and unsaturated organic acids such as maleic acid and itaconic acid or suitably substituted alkynes as those taught by EP 2 671 969 A1. It is also within the scope of the present invention to use combinations of stabilising agents such as bismuth ions and mercaptobenzoic acids, mercaptocarboxylic acids and/or mercaptosulphonic acids as taught by WO 2013/113810. The electroless nickel plating bath may comprise a plating rate modifier such as those disclosed in European patent application EP 14198380.9 (published as EP 3 034 650 A1) to advantageously reduce the plating rate and to stabilise the plating bath. The concentration of the at least one optional stabilising agent in the electroless nickel plating bath ranges from 0.1 to 100 mg/l, preferably from 0.5 to 30 mg/l.

The electroless nickel plating bath may comprise—but does not necessarily comprise—further additives such as wetting agents, surfactants, accelerators, brighteners, grain refining additives etc. These components are known in the art.

In case a hypophosphite compound is used as the reducing agent for nickel, nickel and phosphorous containing alloy deposits are obtained. The amount of phosphorous in said alloy deposit depends inter alia on the concentration of hypophosphite and nickel ions in the electroless nickel plating bath and the optional stabilising agent. Preferably, the amount of phosphorous in said alloy deposit ranges from 5 to 15 wt.-% with the balance being nickel.

In case a boron-based reducing agent is used as the reducing agent for nickel, nickel and boron containing alloy deposits are obtained. The amount of boron in said alloy deposit depends inter alia on the concentration of boron-based reducing agent and nickel ions in the electroless nickel plating bath and the optional stabilising agent or the pH value. Preferably, the amount of boron in said alloy deposit ranges from 1 to 10 wt.-% with the balance being nickel.

In case one or more of hydrazine and formaldehyde are used as the reducing agents for nickel, pure nickel deposits are obtained.

The electroless nickel plating bath may optionally comprise a second source of metal ions such as molybdenum, rhenium or tungsten ions. These second metal ions may preferably be added as water soluble salts or compounds such as $MoO_2(OH)_2$, $ReO_2(OH)_2$, $WO_2(OH)_2$, $Na_2MoO_4$, $Na_2ReO_4$ and $Na_2WO_4$ and their respective hydrates.

The amount of second metal ions added to the electroless nickel plating bath preferably ranges from 0.01 to 0.2 mol/l, more preferably from 0.05 to 0.15 mol/l. The amount of second metal ions in the electroless nickel plating bath may be sufficient to reach a concentration of 4 to 20 wt.-% of second metal in the deposited nickel alloy.

Alternatively, copper or copper alloys may be deposited as metal or metal alloy on the activated silicon substrate in step (iii). Copper or alloys thereof are conventionally deposited on silicon substrates in the manufacturing of solar cells. An electroless copper or copper alloy bath comprises a source of copper ions, a reducing agent, a complexing agent and typically a stabilising agent. U.S. Pat. No. 7,220,296, WO 2014/154702, G. O. Mallory, J. B. Hajdu, Electroless Plating: Fundamentals And Applications, Reprint Edition, American Electroplaters and Surface Finishers Society, pp. 289-295, U.S. Pat. No. 4,617,205, US 2008/0223253 and in particular European patent application EP 14198380.9 (published as EP 3 034 650 A1) are incorporated herein by reference in their entirety and describe these aforementioned compounds and other suitable additives (in applicable concentrations and useful parameters) to be used in electroless copper or copper alloy deposition.

Cobalt and alloys thereof may be used as barrier layers on silicon substrates. Such barrier layers are used in chip making. They are placed e.g. between a copper line and a silicon layer and are to inhibit copper migration into the silicon layer. Particularly, ternary cobalt-tungsten-phosphorous and cobalt-molybdenum-phosphorous alloys can be used for this purpose. An electroless cobalt or cobalt alloy bath comprises a source of copper ions, a reducing agent, a complexing agent and typically a stabilising agent. US 2005/0161338, WO 2013/135396 and European patent application EP 14198380.9 (published as EP 3 034 650 A1) describe these aforementioned compounds and further suitable additives (in applicable concentrations and useful parameters) to be used in electroless cobalt or cobalt alloy deposition and are incorporated herein by reference in their entirety.

The deposited metal or metal alloy layer preferably has a thickness of below 150 nm, more preferred it ranges from 1 to 50 nm, even more preferred it ranges from 2 to 20 nm.

The at least one silicon substrate or at least a portion of its surface may be contacted with the electroless metal plating bath and the activation composition by means of spraying, wiping, dipping, immersing or by other suitable means. Electroless metal plating according to step (iii) in the process according to the present invention can be performed in horizontal, reel-to-reel, vertical, vertically conveyorized or spray plating equipment. A particularly suitable plating tool which can be used to carry out the process according to the present invention is disclosed in US 2012/0213914 A1.

The silicon substrate may be contacted with the electroless metal plating bath for 1 second to 30 min, preferably for 30 seconds to 10 minutes, more preferably for 40 seconds to 3 minutes, most preferably for 45 seconds to 3 minutes. The contact times of silicon substrate and activation composition and of activated silicon substrate and electroless metal or metal alloy plating bath have an influence on the metal or metal alloy layer thickness obtained. The person skilled in the art can therefore determine the necessary durations of contact in both steps to achieve a certain metal or metal alloy layer thickness.

The inventive method for activating a silicon substrate may comprise a further step after step (iii)
 (iv) heat treatment of the silicon substrate and thereby forming a metal silicide.

The at least one silicon substrate may be heat treated at a temperature between 300 and 750° C. for 30 to 60 seconds in an inert gas such as nitrogen or argon. Upon heat treating the silicon substrate with the metal or metal alloy layer deposited on its surface the metal diffuses into the silicon substrate and a metal silicide is formed. This heat treatment is well-established in the art and sometimes referred to as rapid thermal annealing (abbreviated commonly as RTA). U.S. Pat. No. 6,406,743 B1 teaches various heat treatment protocols which may be used in the context of the present invention.

Any residual metal or metal alloy left on the surface of the silicon substrate after the heat treatment may be removed by wet-chemical etching, chemical-mechanical planarization (or any other suitable means), thereby leaving the metal silicide over the silicon substrate. Means to remove metals or metal alloys are known in the art. Nickel or alloys thereof can be removed by a two-step etch as disclosed in U.S. Pat. No. 6,406,743 B1.

The method according to the invention may comprise further rinsing, cleaning, etching and pre-treatment steps, all of which are known the art.

The method according to the invention is particularly suitable to form interconnects made of metal silicides such as nickel silicide interconnects. These interconnects can be exemplarily used in the manufacturing of MOS transistors, CMOS transistors, IC substrates (VLSI). Products' containing such interconnects may be memory sticks (USB sticks), MS cards, SD cards, power diodes and power transistors. Alternatively, the method according to the invention can be used to form barrier layers on silicon substrates such as cobalt alloy barrier layers. It also may be used in the metallization of silicon substrates to be used in the production of solar cells.

It is an advantage of the present invention that very thin and uniformly distributed palladium seed layers with layer thickness of less than 10 nm or even less than 5 nm can be obtained. These palladium seed layers then allow for ultra-thin metal or metal alloy layers of 50 nm or 25 nm or even 15 nm or less such as nickel or nickel alloy layers to be deposited thereon. Due to very thin and uniformly distributed palladium seed layers metal or metal alloy layers formed thereupon are even, flat and smooth (which can be measured e.g. by atomic force microscopy and XRF, respectively; see example 5). The thus formed metal or metal alloy layers can then be converted into metal silicides with no or only reduced chemical-mechanical planarization step requirements.

The invention will now be illustrated by reference to the following non-limiting examples.

EXAMPLES

The substrates were analysed visually by SEM (Zeiss Ultra Plus, SE2 detector, acceleration voltage 3.0 kV or 5.0 kV, data given in the individual Figures). Surface coverages were determined using Stream software from Olympus to quantify the measured SEM pictures.

The metal (alloy) deposit thickness was measured at 5 points of each substrate by XRF using the XRF instrument Fischerscope XDV-SDD (Helmut Fischer GmbH, Germany). By assuming a layered structure of the deposit the layer thickness can be calculated from such XRF data.

The smoothness (or roughness) of surfaces was determined by a scanning atomic force microscope (Digital Instruments, NanoScope equipped with a PointProbe® from Nanosensors with a tip radius of less than 7 nm), scan size: 5 times 2×2 μm, scan in tapping mode. The average roughness ($S_A$), the maximum height difference ($S_T$) and RSAI values (relative surface area increase) were obtained by these measurements and are provided with the respective examples below.

Example 1 (Comparative)

An n-doped polysilicon substrate was immersed for 120 seconds into an aqueous solution containing 0.1 g/l $Pd^{2+}$ ions (from $PdSO_4$) and 1 wt.-% HF at room temperature. The surface was inhomogeneously covered by palladium particles with a mean surface coverage of (32.0±1.3) % (see FIG. 1).

Example 2 (Comparative)

An n-doped polysilicon substrate was immersed for 120 seconds into an aqueous solution containing 0.1 g/l $Pd^{2+}$ ions (from $PdSO_4$), 1 wt.-% HF and 0.5 ml/l of glacial acetic acid at room temperature. The surface was inhomogeneously covered by palladium particles with a mean surface coverage of (32.0±1.2) % (see FIG. 2).

Example 3

An n-doped polysilicon substrate was immersed for 120 seconds into an aqueous solution of 0.1 g/l $Pd^{2+}$ ions (from $PdSO_4$), 1 wt.-% HF which further comprised the aromatic acids as given in Table I at room temperature. The results and treatment conditions are also given in said table.

TABLE I

Surface coverage obtained from various activation compositions.

| # | Aromatic acid | Concentration [mg/L] | Immersion time [s] | Surface coverage [%] |
|---|---|---|---|---|
| a. | 5-amino-naphtalenesulphonic acid[1] | 100 | 120 | 54.6 ± 1.4 |
| b. | para-toluenesulphonic acid[1] | 100 | 120 | 30.2 ± 6.8 |
| c. | phthalic acid[1] | 2500 | 60 | 53.4 ± 4.9 |
| d. | 2-naphtalenesulphonic acid[1] | 50 | 120 | 45.7 ± 0.2 |
| e. | 7-amino-4-hydroxy-2-naphtalenesulphonic acid + trimesic acid + 3,5-dinitrobenzoic acid + 4-aminobenzoic acid + 5-amino-naphtalenesulphonic acid[2] | 20 each | 60 | 86.3 ± 0.8 |
| f. | 7-amino-4-hydroxy-2-naphtalenesulphonic acid + trimesic acid + 3,5-dinitrobenzoic acid + 4-aminobenzoic acid + 5-amino-naphtalenesulphonic acid[2] | 20 each | 120 | 86.4 ± 1.4 |

[1]comparative example;
[2]inventive example

Comparative examples a., c. and d. all showed a significantly improved surface coverage of the silicon surface with palladium compared to comparative examples 1 and 2 which contained no aromatic acids. However, comparative example b. using para-toluenesulphonic acid resulted even in a worse surface coverage than those examples. Contrary to that, when using more than one aromatic acid in inventive example e., the surface coverage excelled to almost complete coverage. It should be borne in mind that the immersion time was shorter in this case than in many comparative examples and that the total concentration was the same as in most of the comparative examples. Hence, the combination of two or more aromatic acids is synergistic expediting the process and allowing for improved surface coverages to be obtained.

Example 4

A polysilicon substrate was immersed for 60 or 120 seconds into an aqueous solutions each containing 0.1 g/l $Pd^{2+}$ ions (from $PdSO_4$), 1 wt.-% HF and one or more aromatic acid in respective concentrations as can be seen in the following Table II.

TABLE II

Example 4.

Figure 3:
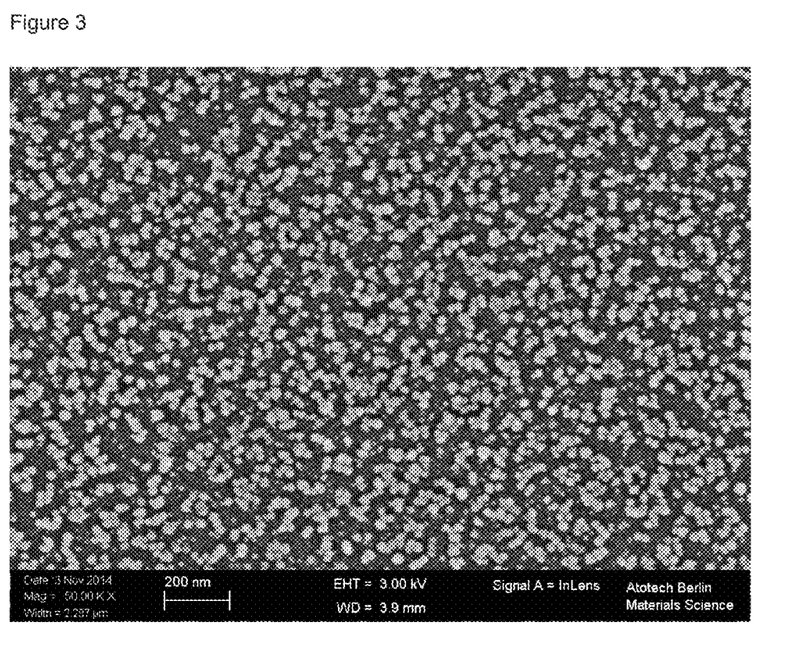
FIGS. 3 to 7 are SEM pictures of polysilicon substrates treated with aqueous activation compositions according to the invention containing hydrofluoric acid, palladium ions and one or more aromatic acids.
Figure 4:
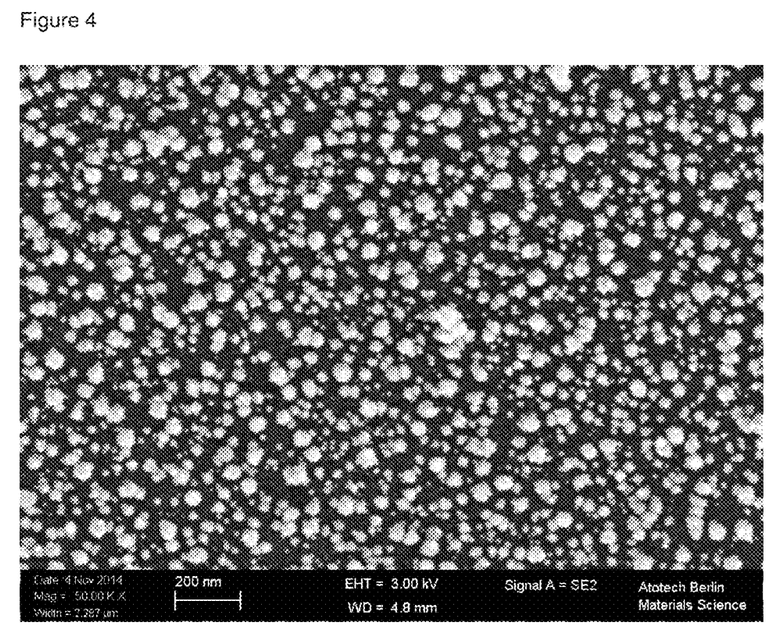
Figure 5:
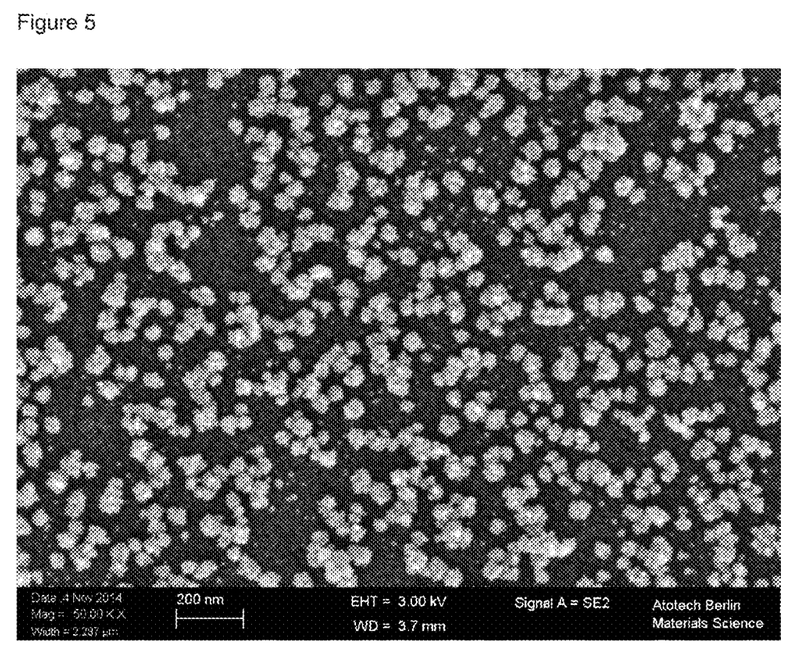
Figure 6:
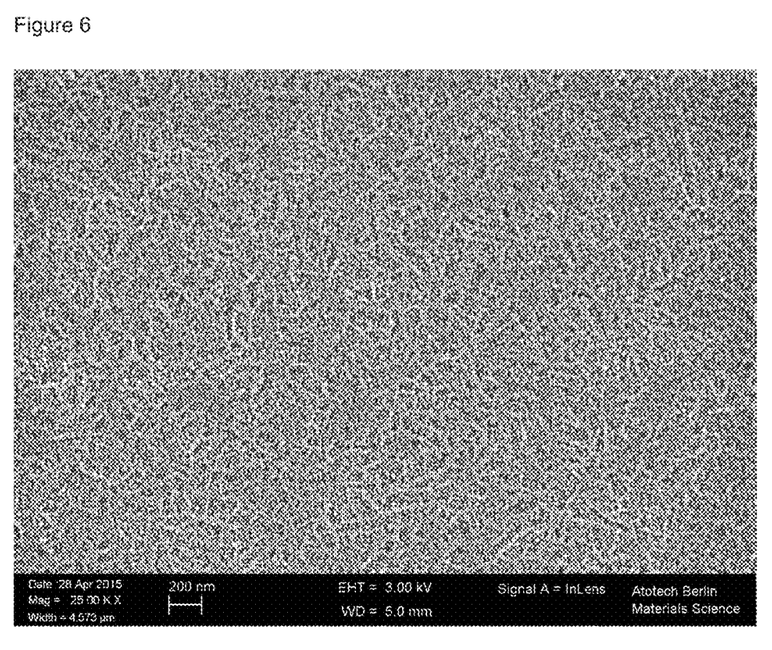
Figure 7:
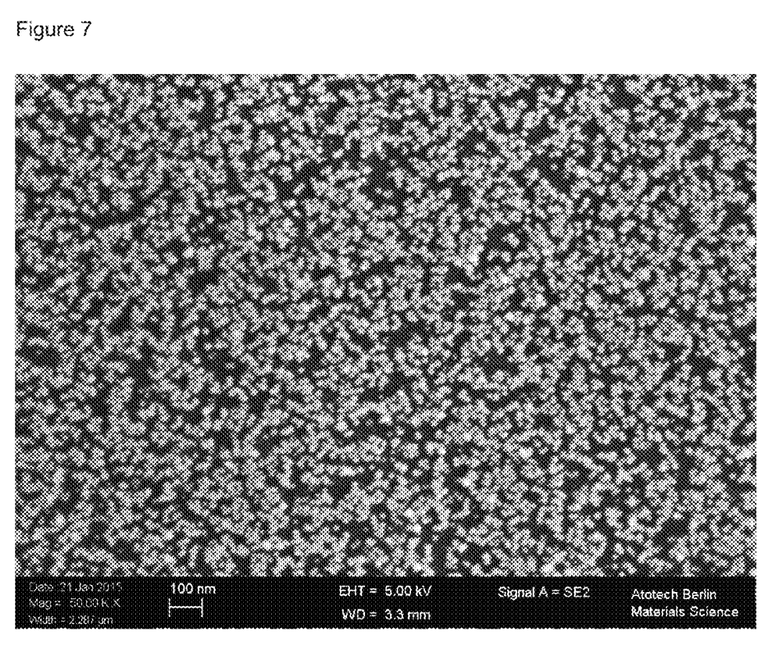

| # | Aromatic acid | Concentration | Immersion time | Corresponding FIG. |
|---|---|---|---|---|
| a. | 7-amino-4-hydroxy-2-naphtalenesulphonic acid[1] | 56 mg/l | 120 s | FIG. 3 |
| b. | trimesic acid[1] | 53 mg/l | 120 s | FIG. 4 |
| c. | 3,5-dinitrobenzoic acid[1] | 52 mg/l | 120 s | FIG. 5 |
| d. | 7-amino-4-hydroxy-2-naphtalenesulphonic acid + 5-amino-naphtalenesulphonic acid[2] | 20 mg/L each | 60 s | FIG. 6 |
| e. | 7-amino-4-hydroxy-2-naphtalenesulphonic acid + trimesic acid + 3,5-dinitrobenzoic acid + 4-aminobenzoic acid +5-amino-naphtalenesulphonic acid[2] | 51 mg/l + 105 mg/l + 99 mg/l + 107 mg/l + 106 mg/l | 120 s | FIG. 7 |

[1]comparative example;
[2]inventive example

Figure 1:
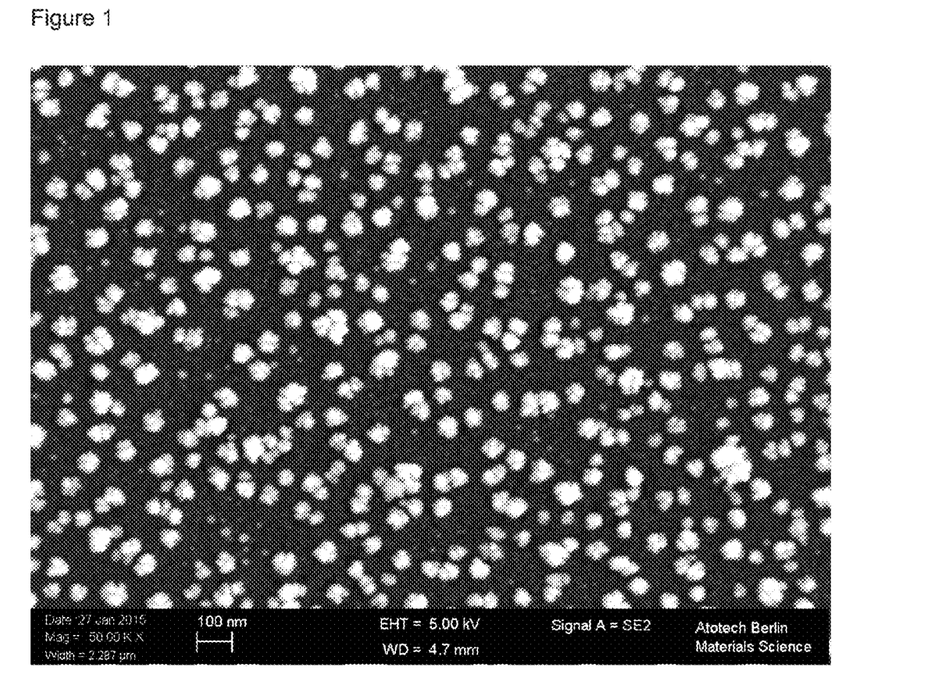
FIG. 1 is a SEM picture of an n-doped silicon substrate treated with a comparative aqueous activation composition consisting of hydrofluoric acid and palladium ions (corresponding to example 1).
Figure 2:
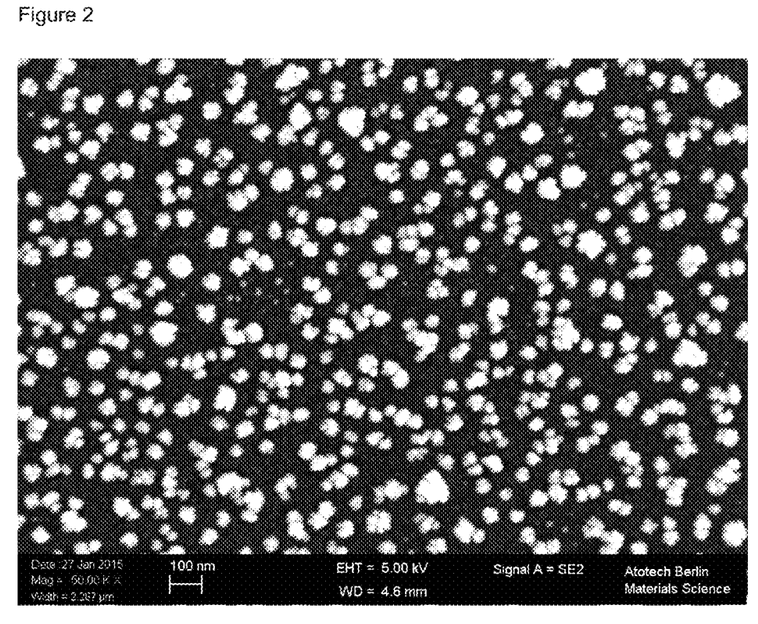
FIG. 2 is a SEM picture of an n-doped silicon substrate treated with a comparative aqueous activation composition consisting of hydrofluoric acid, acetic acid and palladium ions (corresponding to example 2).

The activation solutions of Example 4 all showed improved coverages of the surfaces of the substrates compared to comparative examples 1 and 2. The individual particles as seen in the SEM pictures were mostly smaller and rather more homogeneously dispersed on the entire surface of the substrate (compared to comparative examples 1 and 2) but still not sufficient for today's demands. Only when using two or more aromatic acids in the activation composition, much more homogeneous coverages and particle distributions on the surface (entries d. and e. in Table 1) were obtained. It can also be seen that the individual particles obtained from inventive examples 4d. and 4e. were smaller when compared to comparative examples 4a. to 4c. and the surfaces received from the inventive examples were substantially free of bigger aggregated particles.

Therefore, it was found that a synergistic effect results from the use of two or more aromatic acids in the activation solution.

Example 5 (Inventive)

n-doped polysilicon substrates were immersed in the aqueous activation composition of Example 3e for 60 (Example 5a) and 120 seconds (Example 5b), respectively. The thus activated silicon substrates were immersed into electroless nickel plating baths each having a pH of 4.3 and containing 6 g/l nickel ions (provided as nickel sulphate), dicarboxylic acids, tricarboxylic acids and hydroxyl carboxylic acids as complexing agents as well as 0.25 g/l dimethylaminoborane as reducing agent at 65° C. for 600 seconds.

The silicon substrates were homogeneously covered with nickel boron alloys. The thicknesses and roughnesses can be found in
Table III.

TABLE III

Layer deposit thicknesses and roughnesses.

| Example | Pd layer thickness [nm] | Ni layer thickness [nm] | $S_A$ [nm] | $S_T$ [nm] | RSAI [%] |
|---|---|---|---|---|---|
| 5a | 4 | 14 | 2.80 | 34.0 | 4.8 |
| 5b | 8 | 22 | 3.14 | 39.6 | 4.1 |

Figure 8:
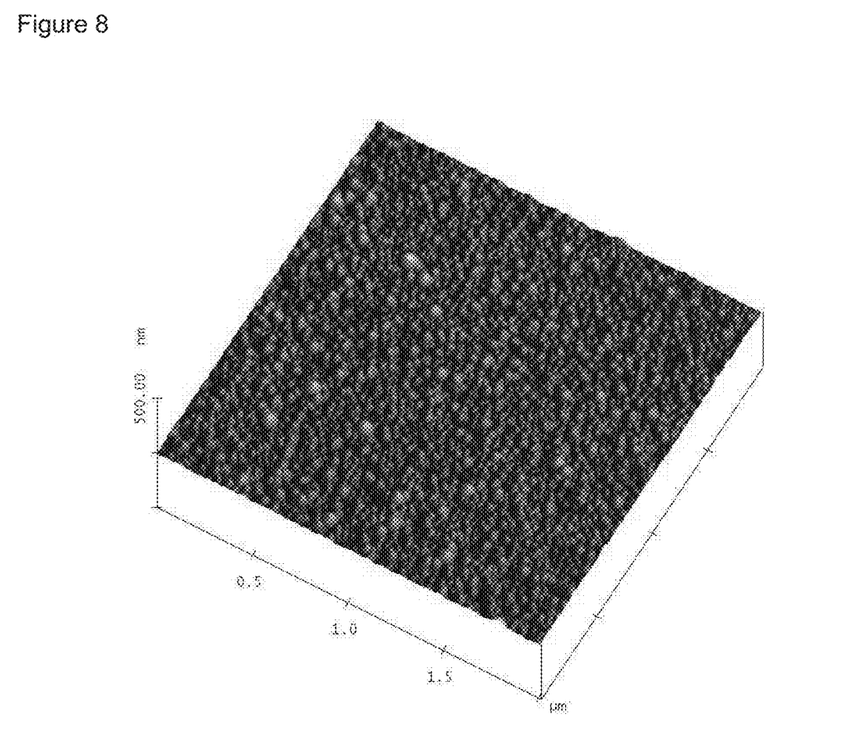
FIG. 8 is a AFM picture of an n-doped polysilicon substrate treated with an inventive activation solution which has been subsequently treated with an electroless nickel plating bath (relates to example 5a).

Very thin layers, both of palladium and nickel boron were obtained by the treatment according to the invention. The layers were also very smooth and showed very little deviation in roughness which is highly desirable when manufacturing current semiconductor devices. The AFM picture of Example 5a is shown in FIG. 8.

The invention claimed is:

1. An activation composition for the activation of silicon substrates, wherein the activation composition is an aqueous solution comprising:
   a) source of palladium ions;
   b) a source of fluoride ions; and
   c) at least two aromatic acids selected from the group consisting of aromatic carboxylic acids, aromatic sulphonic acids, aromatic sulphinic acids, aromatic phosphonic acids and aromatic phosphinic acids.

2. The activation composition of claim 1 wherein the at least two aromatic acids are selected from the group consisting of aromatic carboxylic acids, aromatic sulphonic acids and aromatic phosphonic acids.

3. The activation composition of claim 1 wherein the at least two aromatic acids are selected from aromatic acids according to formulae (I) and (II):

wherein $R^1$ to $R^{14}$ are independently from each other selected from the group consisting of hydrogen, alkyl, aryl, halides, amino, sulphonic acid moiety, carboxylic acid moiety, phosphonic acid moiety, nitro and hydroxyl with the proviso that at least one of $R^1$ to $R^{14}$ is a sulphonic acid moiety, a carboxylic acid moiety or a phosphonic acid moiety.

4. The activation composition according to claim 3, wherein at least one of the two aromatic acids according to formulae I and II has the proviso that at least one of $R^1$ to $R^{14}$ is a sulphonic acid moiety.

5. The activation composition according to claim 3, wherein at least one of the two aromatic acids according to formulae I and II has the proviso that at least one of $R^1$ to $R^{14}$ is a carboxylic acid moiety.

6. The activation composition according to claim 3, wherein one of the two aromatic acids according to formulae I and II has the proviso that at least one of $R^1$ to $R^{14}$ is a sulphonic acid moiety, and one of the two aromatic acids according to formulae I and II has the proviso that at least one of $R^1$ to $R^{14}$ is a carboxylic acid moiety.

7. The activation composition according to claim 1 wherein the at least two aromatic acids are selected from the group consisting of benzoic acid, 1,2-benzene dicarboxylic acid (phthalic acid), 1,3-benzenedicarboxylic acid (isophthalic acid), 1,4-benzene dicarboxylic acid (terephthalic acid), 1,2,3-benzene tricarboxylic acid (hemimellitic acid), 1,2,4-benzene tricarboxylic acid (trimellitic acid), 1,3,5-benzene tricarboxylic acid (trimesic acid), 1,2,4,5-benzene tetracarboxylic acid (pyromellitic acid), 1,2,3,4,5-benzene pentacarboxylic acid, 1,2,3,4,5,6-benzene hexacarboxylic acid (mellitic acid), 2-nitrobenzoic acid, 3-nitrobenzoic acid, 4-nitrobenzoic acid, 2,5-dinitrobenzoic acid, 2,6-dinitrobenzoic acid, 3,5-dinitrobenzoic acid, 2,4-dinitrobenzoic acid, 3,4-dinitrobenzoic acid, 2-aminobenzoic acid, 3-aminobenzoic acid, 4-aminobenzoic acid, 3,4-diaminobenzoic acid, 3,5-diaminobenzoic acid, 2,3-aminobenzoic acid, 2,4-diaminobenzoic acid, salicylic acid, p-toluenesulphonic acid, 1-naphthoic acid, 2-naphthoic acid, 2,6-naphthalenedicarboxylic acid, 2-naphthalenesulphonic acid, 5-amino-1-naphtalenesulphonic acid, 5-amino-2-naphtalenesulphonic acid, 7-amino-4-hydroxy-2-naphthalenesulphonic acid and phenyl phosphonic acid.

8. The activation composition according to claim 1 wherein the concentration of the at least two aromatic acids in the activation composition ranges from 0.1 to 1000 mg/L.

9. The activation composition according to claim 1 wherein the concentration of the at least two aromatic acids in the activation composition ranges from 1 to 750 mg/L.

10. The activation composition according to claim 1 wherein the activation composition further comprises d) methane sulphonic acid and/or a mineral acid selected from the group consisting of sulphuric acid, hydrochloric acid, nitric acid, phosphoric acid, methane sulphonic acid, hydrobromic acid, hydrogen iodide, perchloric acid, aqua regia, hydrochlorous acid, iodic acid and nitrous acid.

11. A method for activating at least one silicon substrate which comprises the following steps in the given order:
   providing the at least one silicon substrate;
   (ii) activating at least a part of the surface of said at least one silicon substrate with the activation composition according to claim 1.

12. The method of claim 11 characterized in that the silicon substrates comprise surfaces made of silicon oxide, polysilicon, p-doped polysilicon, n-doped polysilicon, silicon nitride and silicon oxynitride.

13. The method according to claim 11 characterized in that the method comprises a further step after step (ii):
   (iii) electroless plating of a metal or a metal alloy on the activated silicon substrate.

14. The method of claim 13 wherein the metal to be deposited is selected from the group consisting of copper, cobalt, nickel, copper alloy, cobalt alloy and nickel alloy.

15. The method of claim 13 characterized in that the method further comprises after step (iii):

(iv) heat treatment of the silicon substrate and thereby forming a metal silicide.

16. The method of claim 14 characterized in that the method further comprises after step (iii):

(iv) heat treatment of the silicon substrate and thereby forming a metal silicide.

17. The activation composition according to claim 4, wherein the at least one other aromatic acid according to formulae I and II has the proviso that at least one of $R^1$ to $R^{14}$ is a carboxylic acid moiety.

18. The activation composition of claim 2 wherein the at least two aromatic acids are selected from aromatic acids according to formulae (I) and (II):

and wherein $R^1$ to $R^{14}$ are independently from each other selected from the group consisting of hydrogen, alkyl, aryl, halides, amino, sulphonic acid moiety, carboxylic acid moiety, phosphonic acid moiety, nitro and hydroxyl with the proviso that at least one of $R^1$ to $R^{14}$ is a sulphonic acid moiety, a carboxylic acid moiety or a phosphonic acid moiety.

19. The activation composition according to claim 18, wherein at least one of the aromatic acids according to formulae I and II has the proviso that at least one of $R^1$ to $R^{14}$ is a sulphonic acid moiety.

20. The activation composition according to claim 18, wherein at least one of the aromatic acids according to formulae I and II has the proviso that at least one of $R^1$ to $R^{14}$ is a carboxylic acid moiety.

21. The activation composition according to claim 18, wherein one of the two aromatic acids according to formulae I and II has the proviso that at least one of $R^1$ to $R^{14}$ is a sulphonic acid moiety, and one of the two aromatic acids according to formulae I and II has the proviso that at least one of $R^1$ to $R^{14}$ is a carboxylic acid moiety.

* * * * *